United States Patent
Kagoshima (10) Patent No.: US 9,666,179 B2
(45) Date of Patent: *May 30, 2017

(54) SPEECH SYNTHESIS APPARATUS AND METHOD UTILIZING ACQUISITION OF AT LEAST TWO SPEECH UNIT WAVEFORMS ACQUIRED FROM A CONTINUOUS MEMORY REGION BY ONE ACCESS

(71) Applicant: Kabushiki Kaisha Toshiba, Minato-ku (JP)

(72) Inventor: Takehiko Kagoshima, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 280 days.

This patent is subject to a terminal disclaimer.

(21) Appl. No.: 14/191,082

(22) Filed: Feb. 26, 2014

(65) Prior Publication Data
US 2014/0180681 A1    Jun. 26, 2014

Related U.S. Application Data

(60) Division of application No. 13/860,319, filed on Apr. 10, 2013, now Pat. No. 8,731,933, which is a
(Continued)

(30) Foreign Application Priority Data

May 18, 2006    (JP) ................................. 2006-139587

(51) Int. Cl.
*G10L 13/06*    (2013.01)
*G10L 19/00*    (2013.01)
(Continued)

(52) U.S. Cl.
CPC .............. *G10L 13/02* (2013.01); *G10L 13/04* (2013.01); *G10L 13/047* (2013.01); *G10L 13/06* (2013.01);
(Continued)

(58) Field of Classification Search
CPC ..... G10L 13/047; G10L 15/144; G10L 13/07; G10L 13/08; G11C 7/16
(Continued)

(56) References Cited

U.S. PATENT DOCUMENTS 5,502,790 A * 3/1996 Yi ......................... G10L 15/144
                                                                704/243
5,740,320 A    4/1998 Itoh
(Continued)

FOREIGN PATENT DOCUMENTS

JP    8-254993      10/1996
JP    2001-282278   10/2001
JP    2005-266010   9/2005

OTHER PUBLICATIONS

Masatsune Tamura et al., "Scalable Concatenative Speech Synthesis Based on the Plural Unit Selection and Fusion Method", Acoustics, Speech and Signal Processing, XP-010792049, Mar. 18, 2005, pp. 361-364.

(Continued)

*Primary Examiner* — Farzad Kazeminezhad
(74) *Attorney, Agent, or Firm* — Oblon, McClelland, Maier & Neustadt, L.L.P.

(57) ABSTRACT

A waveform memory that stores a plurality of speech unit waveforms corresponding to respective speech units, wherein an address order of the speech unit waveforms is determined by a sort order of speech units included in a speech unit sequence corresponding to a phoneme sequence of training data, and the speech units included in the speech
(Continued)

unit sequence are selected so as to synthesize a speech of the phone sequence.

20 Claims, 11 Drawing Sheets

Related U.S. Application Data continuation of application No. 11/745,785, filed on May 8, 2007, now Pat. No. 8,468,020.

(51) Int. Cl.

| | | |
|---|---|---|
| *G10L 13/00* | (2006.01) | |
| *G10L 13/02* | (2013.01) | |
| *G10L 13/047* | (2013.01) | |
| *G10L 13/04* | (2013.01) | |
| *G10L 13/08* | (2013.01) | |
| *G11C 7/16* | (2006.01) | |
| *G10L 15/06* | (2013.01) | |
| *G10L 13/07* | (2013.01) | |

(52) U.S. Cl.
CPC ............ *G10L 13/08* (2013.01); *G10L 15/063* (2013.01); *G11C 7/16* (2013.01); *G10L 13/07* (2013.01)

(58) Field of Classification Search
USPC .................................................. 704/201, 243
See application file for complete search history.

(56) References Cited

U.S. PATENT DOCUMENTS

| | | | |
|---|---|---|---|
| 7,031,919 | B2 | 4/2006 | Okutani et al. |
| 7,219,060 | B2 | 5/2007 | Coorman et al. |
| 7,603,278 | B2 | 10/2009 | Fukada et al. |
| 8,468,020 | B2 * | 6/2013 | Kagoshima ........... G10L 13/047 704/201 |
| 2003/0115049 | A1 | 6/2003 | Beutnagel et al. |
| 2005/0137870 | A1 | 6/2005 | Mizutani et al. |
| 2006/0085194 | A1 | 4/2006 | Okutani et al. |

OTHER PUBLICATIONS

Mark Beutnagel et al., "Interaction of Units in a Unit Selection Database", Eurospeech, XP-001075865, vol. 3, No. 6, Sep. 1999, pp. 1063-1066.

Mark Beutnagel, et al., "Rapid Unit Selection From a Large Speech Corpus for Concatenative Speeh Synthesis", Eurospeech, XP-007001051, vol. 2, 1999.

Marcello Balestri et al., "Choose the Best to Modify the Least: A New Generation Concatenative Synthesis System", Eurospeech, XP-007001473, vol. 5, Sep. 1999.

Andrew J. Hunt et al., "Unit Selection in a Concatenative Speech Synthesis System Using a Large Speech Database", IEEE Conference on Acoustics, Speech and Signal Processing, XP-002133444, 1996, pp. 373-376.

\* cited by examiner

TEXT            KONNICHIWA

PHONEME SEQUENCE    koxnichiwa

FIG. 3

| PHONEME SEQUENCE | k | o | x | n | ... |
|---|---|---|---|---|---|
| FUNDAMENTAL FREQUENCY (Hz) | 0.0 | 230.0 | 215.0 | 210.0 | |
| PHONEME SEGMENTAL DURATION (msec) | 150.0 | 110.0 | 60.0 | 50.0 | |

FIG. 4

| SYNTHESIS UNIT (PHONEME) | a、 i、 u、 e、 o<br>k、 s、 t、 n、 h ... |
|---|---|

FIG. 5

TEXT　　　　　　　　　　KONNICHIWA

PHONEME SEQUENCE　　　koxnichiwa

SPEECH UNIT SEQUENCE　k(1) o(4) x(2) n(6) i(3) ch(1) i(2) w(5) a(3)

FIG. 6

| UNIT NAME | UNIT WAVEFORM POSITION (byte) | UNIT NUMBER | PHONEME NAME | FUNDAMENTAL FREQUENCY (Hz) | PHONEME SEGMENTAL DURATION (msec) | CEPSTRUM OF UNIT BOUNDARY |
|---|---|---|---|---|---|---|
| a (1) | HEAD : 23093<br>SIZE : 2560 | 12 | /a/ | 221.0 | 83.0 | FRONT : (2.9, 1.5, ---, 0.04)<br>REAR : (-1.3, 1.4, ---, 0.09) |
| a (2) | HEAD : 35982<br>SIZE : 3072 | 23 | /a/ | 296.0 | 125.0 | FRONT : (2.1, 1.3, ---, 0.12)<br>REAR : (-0.5, 2.5, ---, 0.03) |
| i (1) | HEAD : 45872<br>SIZE : 1792 | 31 | /i/ | 240.0 | 61.0 | FRONT : (1.7, 2.1, ---, 0.04)<br>REAR : (0.8, 1.4, ---, 0.08) |
| ... | ... | ... | ... | ... | ... | ... |

UTTERANCE "CHIISANA SYURAKU DATTANO DESYOH"

FIG. 9

| SEGMENT | 1 | 2 | 3 | 4 | |
|---|---|---|---|---|---|
| PHONEME | k | o | x | n | ... |
| FUNDAMENTAL FREQUENCY | $f_{T1}$ | $f_{T2}$ | $f_{T3}$ | $f_{T4}$ | ... |
| PHONEME SEGMENTAL DURATION | $d_{T1}$ | $d_{T2}$ | $d_{T3}$ | $d_{T4}$ | ... |

FIG. 10A

| SEGMENT | 1 | 2 | 3 | 4 | |
|---|---|---|---|---|---|
| SPEECH UNIT | $u_1$ | $u_2$ | $u_3$ | $u_4$ | ... |
| FUNDAMENTAL FREQUENCY | $f_{u1}$ | $f_{u2}$ | $f_{u3}$ | $f_{u4}$ | ... |
| PHONEME SEGMENTAL DURATION | $d_{u1}$ | $d_{u2}$ | $d_{u3}$ | $d_{u4}$ | ... |
| CEPSTRUM UNIT BOUNDARY | $p_{u1}$ | $p_{u2}$ | $p_{u3}$ | $p_{u4}$ | ... |
| CEPSTRUM UNIT BOUNDARY | $q_{u1}$ | $q_{u2}$ | $q_{u3}$ | $q_{u4}$ | ... |

SPEECH SYNTHESIS APPARATUS AND METHOD UTILIZING ACQUISITION OF AT LEAST TWO SPEECH UNIT WAVEFORMS ACQUIRED FROM A CONTINUOUS MEMORY REGION BY ONE ACCESS

CROSS-REFERENCE TO RELATED APPLICATIONS

This application is a division of and claims the benefit of priority under 35 U.S.C. §120 from U.S. Ser. No. 13/860,319 filed Apr. 10, 2013, which is a continuation of U.S. Ser. No. 11/745,785 filed May 8, 2007 (now U.S. Pat. No. 8,468,020 issued Jun. 18, 2013), and claims the benefit of priority under 35 U.S.C. §119 from Japanese Patent Application No. 2006-139587 filed May 18, 2006; the entire contents of each of which are incorporated herein by reference.

FIELD OF THE INVENTION

The present invention relates to a speech synthesis apparatus and a method for synthesizing speech by concatenating speech unit data read from a large scale memory medium such as a hard disk.

BACKGROUND OF THE INVENTION

Text speech synthesis may artificially generate a speech signal from arbitrary sentences (text data). For example, this technique is disclosed in JP-A (Kokai) No. 08-254993 (page 4 and FIG. 1). A speech synthesis apparatus to realize such text speech synthesis is composed by three elements, i.e., a language processing unit, a prosody processing unit, and a speech synthesis unit.

First, in the language processing unit, an input text is morphologically and syntactically analyzed. Next, in the prosody processing unit, accent and intonation of the analyzed text are processed, and information such as a phoneme sequence, a fundamental frequency, and a phoneme segmental duration are calculated. Last, in the speech synthesis unit, by concatenating speech unit data (feature parameter and speech waveform) based on a fundamental frequency and a phoneme segmental duration (calculated by the prosody processing unit), synthesized speech is generated. In this case, the speech unit data is previously stored for each synthesis unit (For example, a phoneme or a syllable) as a speech connection unit to generate the synthesized speech.

As a method for synthesizing a high quality speech, a large number of speech unit data is previously stored, suitable speech unit data is selected from the stored speech unit data by a prosody/a phoneme environment of the input text, and a synthesized speech is generated by modifying and concatenating the selected speech unit data. This method is disclosed in JP-A (Kokai) No. 2001-282278 (page 3 and FIG. 2). In this method, a cost function to estimate a distortion degree of quality of the synthesized speech (generated by modifying and concatenating speech units) is previously defined. By selecting a plurality of speech units having the lowest cost function from a large number of speech units, a synthesized speech of high quality can be realized.

In the above speech synthesis method, if an expensive semiconductor memory such as RAM is used as a memory medium to store a large number of speech unit data, the cost becomes high. Accordingly, a large capacity memory medium such as a hard disk drive (HDD) is often used.

However, in case of storing speech unit data in the HDD, it takes a long time to read the speech unit data from the HDD. As a result, processing time becomes long, and real time processing is difficult.

In order to solve this problem, a partial copy of speech unit data on the HDD is located on another memory, and a plurality of speech units are selected from the memory on condition that the speech unit on the memory is easy to access. As a result, the number of access from the HDD is reduced and the processing time is reduced. This technique is disclosed in JP-A (Kokai) No. 2005-266010. This speech unit selection is realized by designing the cost function of which value becomes large by penalty of selecting the speech unit from the HDD.

In the above technique, speech unit data on the HDD is hard to be selected by the cost function with penalty, and a number of access from the HDD is reduced. In this case, even if a speech unit suitable for quality is stored in the HDD, another speech unit stored in the memory is often selected. Accordingly, in comparison with the cost function without penalty, speech quality falls. Furthermore, a memory to store a partial copy of the speech unit data is necessary, and the hardware cost increases.

SUMMARY OF THE INVENTION

The present invention is directed to a speech synthesis apparatus and a method for reducing the number of access from a mass memory without falling speech quality and preparing another memory.

According to an aspect of the present invention, there is provided an apparatus for synthesizing a speech of an input phoneme sequence, comprising: a speech unit selection unit configured to select a speech unit sequence corresponding to the input phoneme sequence by referring to the speech unit information stored in an information memory; an acquisition unit configured to acquire a speech unit waveform corresponding to each speech unit of the plurality speech units from a plurality of speech unit waveforms stored in a waveform memory; and a speech unit concatenation unit configured to synthesize the speech by concatenating the speech unit waveform acquired by the acquisition unit; wherein the speech unit waveform acquisition unit acquires at least two speech unit waveforms corresponding to at least two speech units included in the speech unit sequence from a continuous region of the waveform memory during one access.

According to another aspect of the present invention, there is also provided a method for synthesizing a speech of an input phoneme sequence, comprising: storing a plurality of speech unit waveforms in a first memory; correspondingly storing speech unit information and an address of each of the plurality of speech unit waveforms in a second memory; selecting a speech unit sequence corresponding to the input phoneme sequence by referring to the speech unit information stored in the second memory; acquiring a speech unit waveform corresponding to each speech unit of the speech unit sequence from the first memory by referring to the address stored in the second memory; and synthesizing the speech by concatenating the speech unit waveform acquired; wherein the acquiring step comprises acquiring at least two speech unit waveforms corresponding to at least two speech units included in the speech unit sequence from a continuous region of the first memory during one access.

According to still another aspect of the present invention, there is also provided a computer program product, comprising: a computer readable program code embodied in said product for causing a computer to synthesize a speech of an input phoneme sequence, the computer readable program code comprising: a first program code to store a plurality of speech unit waveforms in a first memory; a second program code to correspondingly store speech unit information and an address of each of the plurality of speech unit waveforms in a second memory; a third program code to select a speech unit sequence corresponding to the input phoneme sequence by referring to the speech unit information stored in the second memory; a fourth program code to acquire a speech unit waveform corresponding to each speech unit of the speech unit sequence from the first memory by referring to the address stored in the second memory; and a fifth program code to synthesize the speech by concatenating the speech unit waveform being acquired; wherein the fourth program code comprises a program code to acquire at least two speech unit waveforms corresponding to at least two speech units included in the speech unit sequence from a continuous region of the first memory during one access.

DETAILED DESCRIPTION OF THE EMBODIMENTS

Hereinafter, various embodiments of the present invention will be explained by referring to the drawings. The present invention is not limited to the following embodiments.

(The First Embodiment)

Figure 1:
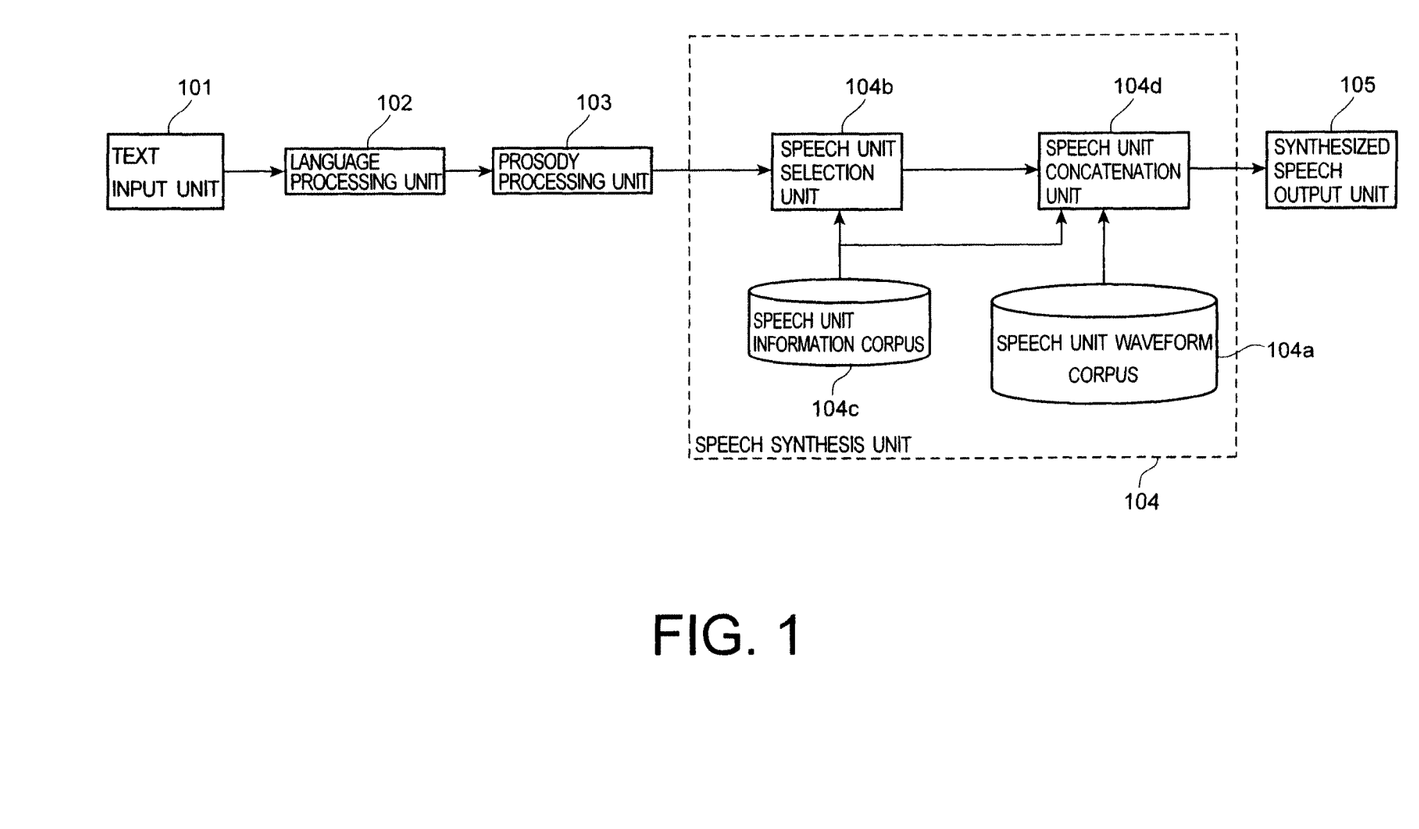
FIG. 1 is a block diagram of a speech synthesis apparatus according to a first embodiment.

FIG. 1 is a block diagram of a speech synthesis apparatus according to the first embodiment. The speech synthesis apparatus comprises a text input unit 101, a language processing unit 102, a prosody processing unit 103, a speech synthesis unit 104, and a synthesized speech output unit 105. The text input unit 101 inputs a text. The language processing unit 102 morphologically and syntactically analyzes the text. The prosody processing unit 103 obtains a phoneme sequence and a target unit environment of the text from the analysis result of the language processing unit 102. The speech synthesis unit 104 selects a plurality of speech units for each synthesis unit from a large number of speech units (previously stored) based on the phoneme sequence and the target unit environment, and generates a synthesized speech by concatenating the plurality of speech units. The synthesized speech output unit 105 outputs a synthesized speech generated by the speech synthesis unit 104.

Furthermore, the speech synthesis unit 104 comprises a speech unit waveform corpus (memory) 104a, a speech unit selection unit 104b, a speech unit information corpus (memory) 104c, and a speech unit concatenation unit 104d. The speech unit waveform corpus 104a stores a plurality of speech unit waveforms each corresponding to a speech unit. The speech unit information corpus 104c stores speech unit information each corresponding to a speech unit (waveform) stored in the speech unit waveform corpus 104a. The speech unit selection unit 104b calculates a distortion of a synthesized speech (generated by concatenating speech units) by referring to the speech unit information, and selects a plurality of speech units for each synthesis unit (segment) based on the distortion. The speech unit concatenation unit 104d reads a plurality of speech unit waveforms each corresponding to a speech unit selected by the speech unit selection unit 104b, and generates a synthesized speech by modifying and concatenating the speech unit waveforms.

Figure 2:
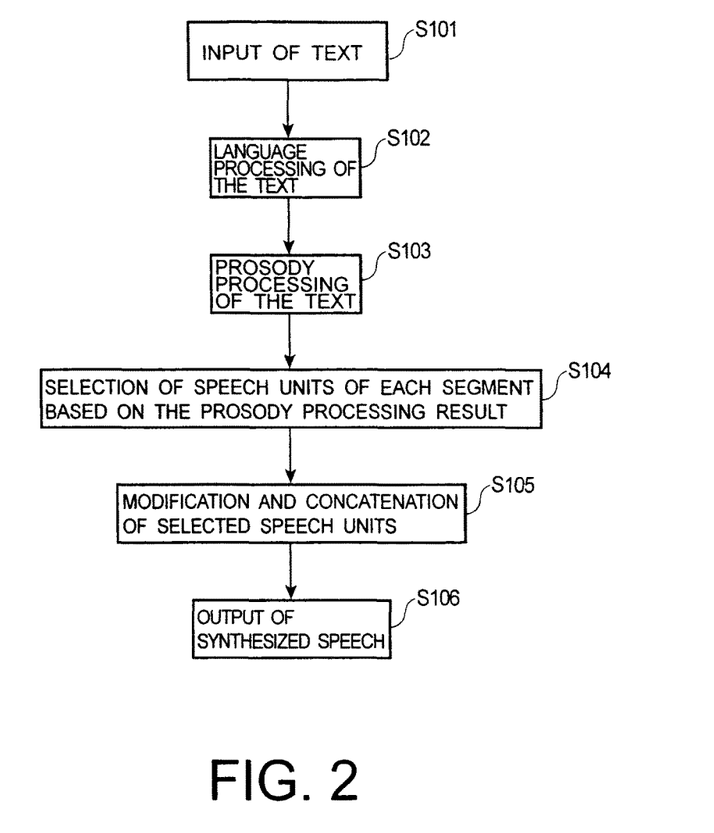
FIG. 2 is a flow chart of processing of the speech synthesis apparatus according to the first embodiment.

Next, operation of the speech synthesis apparatus is explained by referring to FIGS. 1 and 2. FIG. 2 is a flow chart of processing of the speech synthesis apparatus according to the first embodiment.

First, a text to generate a synthesized speech is input to the text input unit 101 by a user (S101). For example, the user may input the text using a keyboard. If a text data file is stored in a memory region (not shown in FIG. 1), the user may selectively indicate the file. The text inputted to the text input unit 101 is sent to the language processing unit 102.

In the language processing unit 102, the text is morphologically and syntactically analyzed (S102). The morphological analysis result and the syntactic analysis result by the language processing unit 102 are sent to the prosody processing unit 103 as a part of speech, read information, and accent position information of each morpheme.

In the prosody processing unit 103, based on the morphological analysis result and the syntactic analysis result by the language processing unit 102, a phoneme sequence and a target unit environment of the text are acquired (S103).

Figure 3:
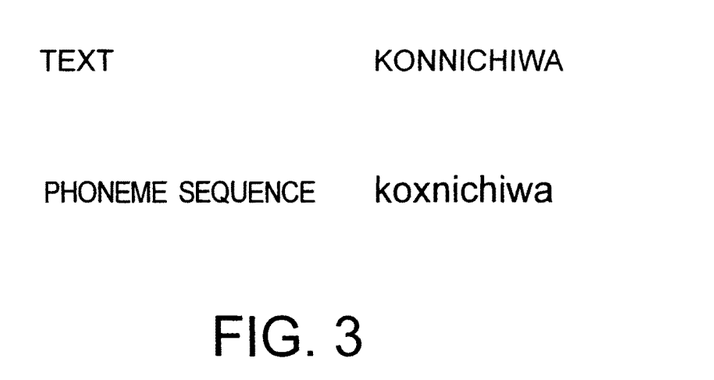
FIG. 3 is a schematic diagram of one example of a phoneme sequence of an input text.

In this case, "phoneme sequence" is a sequence that a text is represented by speech composition units such as a phoneme or a syllable. In the first embodiment, a phoneme sequence is regarded as a sequence of phonemic symbols. FIG. 3 shows an example of a phoneme sequence of the input text "KONNICHIWA". In FIG. 3, "k", "o", "x", "n", "i", "c", "h", "w", "a" represent each phoneme.

Furthermore, "target unit environment" is an environmental property related to each speech unit composing the input text as a target. For example, the unit environment includes a fundamental frequency, a phoneme segmental duration, a power, a unit name, a previous phoneme name, a following phoneme name, a second following phoneme name, a cepstrum of speech unit boundary, existence of stress, a distance from accent core, time from breathing, an utterance speed, and feeling at utterance timing. In the first embodiment, the target unit environment includes the fundamental frequency and the phoneme segmental duration.

Figure 4:
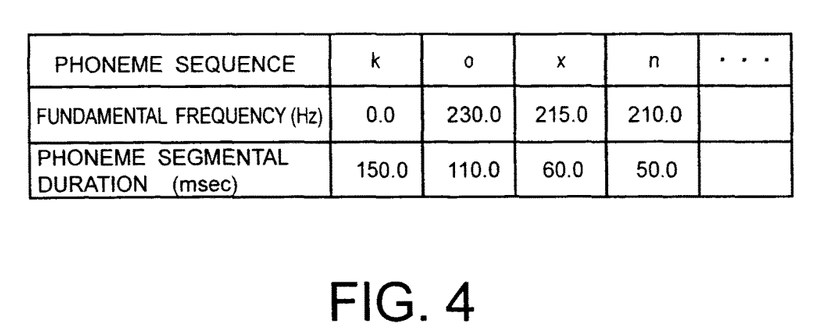
FIG. 4 is a schematic diagram of one example of a fundamental frequency and a phoneme segmental duration of each phoneme.

A phoneme sequence and a target unit environment (fundamental frequency and phoneme segmental duration) acquired by the prosodic processing unit 103 are sent to the speech synthesis unit 104. As shown in FIG. 4, the fundamental frequency and the phoneme segmental duration are related to each phoneme included in the phoneme sequence. In this case, a fundamental frequency of a voiceless consonant "k" does not exist. Accordingly, in FIG. 4, the fundamental frequency is "0.0".

In the speech synthesis unit 104, based on the phoneme sequence and the target unit environment (sent from the prosody processing unit 103), the speech unit selection unit 104b selects a speech unit of each synthesis unit from the speech unit information corpus 104c, and generates a speech unit sequence (S104).

In this case, "synthesis unit" is a speech connection unit to generate a synthesized speech. As the synthesis unit, for example, a half-phoneme, a phoneme, a diphone, a triphone, and a syllable may be used. Furthermore, the synthesis unit may be a combination of these elements. In the first embodiment, the synthesis unit is regarded as a phoneme.

Figure 5:
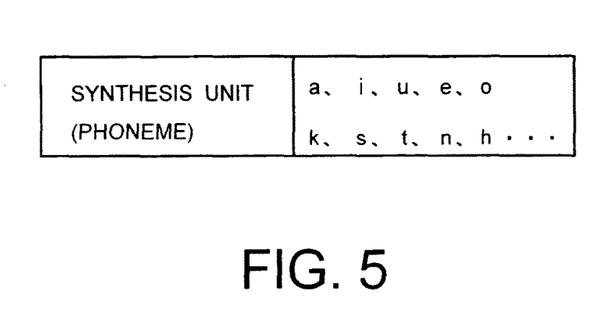
FIG. 5 is a schematic diagram of one example of a synthesis unit as a phoneme.
Figure 6:
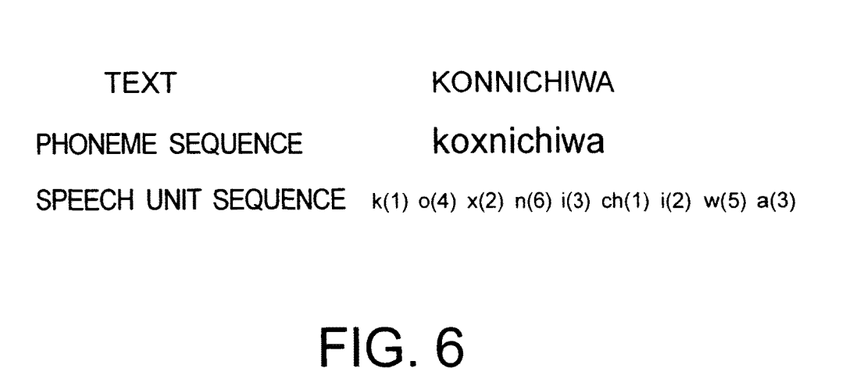
FIG. 6 is a schematic diagram of one example of the input text, a phoneme sequence, and a speech unit sequence selected.

FIG. 5 shows one example of the synthesis unit as a phoneme. FIG. 6 shows one example of a phoneme sequence and a speech unit sequence (selected) corresponding to the input text. In general, a plurality of speech units exists for the same phoneme. Accordingly, a speech unit name is represented by combination of a phoneme sign and a speech unit number of the same phoneme. For example, in FIG. 6, a speech unit "o(4)" represents the fourth speech unit of the phoneme "/o/".

Next, a speech unit sequence of each synthesis unit (obtained by the speech unit selection unit 104b) is sent to the speech unit concatenation unit 104b. In the speech unit concatenation unit 104d, a speech unit waveform of each speech unit included in the speech unit sequence (sent from the speech unit selection unit 104b) is read from the speech unit waveform corpus 104a by referring to unit waveform position information in the speech unit information corpus 104c. By modifying and concatenating the speech unit waveforms based on the target unit environment (obtained by the prosody processing unit 103), a synthesized speech is generated (S105).

In the synthesized speech output unit 105, a synthesized speech sent from the speech synthesis unit 104 is output (S106). For example, the synthesized speech is output using a speaker or a head phone. Furthermore, the synthesized speech may be output as a file on a memory medium such as a semiconductor memory, an optical disk, or a magnetic disk.

Figure 7:
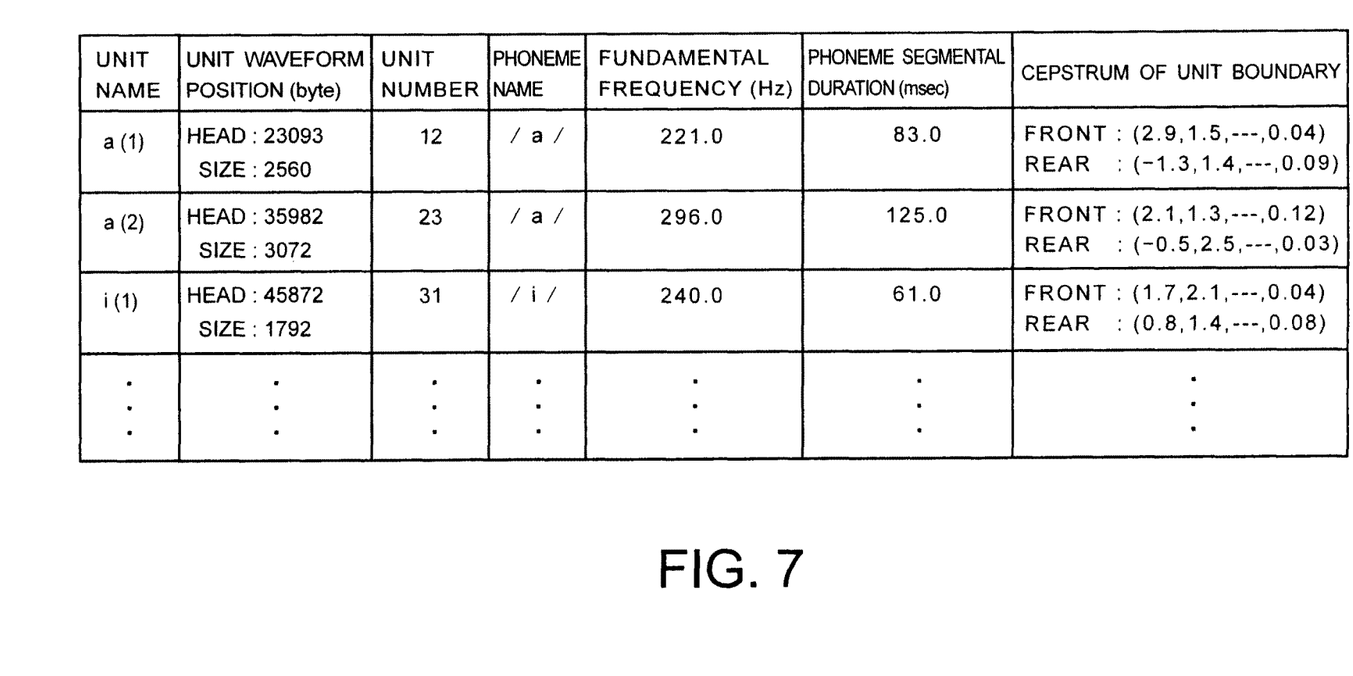
FIG. 7 is a schematic diagram of one example of speech unit information 104c.

In the speech unit information corpus 104c and the speech unit waveform corpus 104a, a speech unit information and a speech unit waveform are correspondingly stored by the same speech unit. The "speech unit information" includes unit waveform position information and unit environment information. FIG. 7 shows one example of the speech unit information.

As to the unit waveform position information, a unit waveform position and a unit number are stored in the speech unit information corpus 104c. As shown in FIG. 7, "unit waveform position" represents a position and a size of the speech unit waveform stored in the speech unit waveform corpus 104a. For example, the position is a head position (a number of bytes) of the speech unit waveform counted from a head address of waveform data of all speech units in a memory region. The size is a data size of the speech unit waveform. Furthermore, a unit number as an order of each speech unit waveform in the speech unit waveform corpus 104a is stored in the speech unit information corpus 104c.

As to the "unit environment information", a phoneme name, a fundamental frequency, a phoneme segmental duration, and cepstrum of speech unit boundary are stored in the speech unit information corpus 104c.

Figure 8:
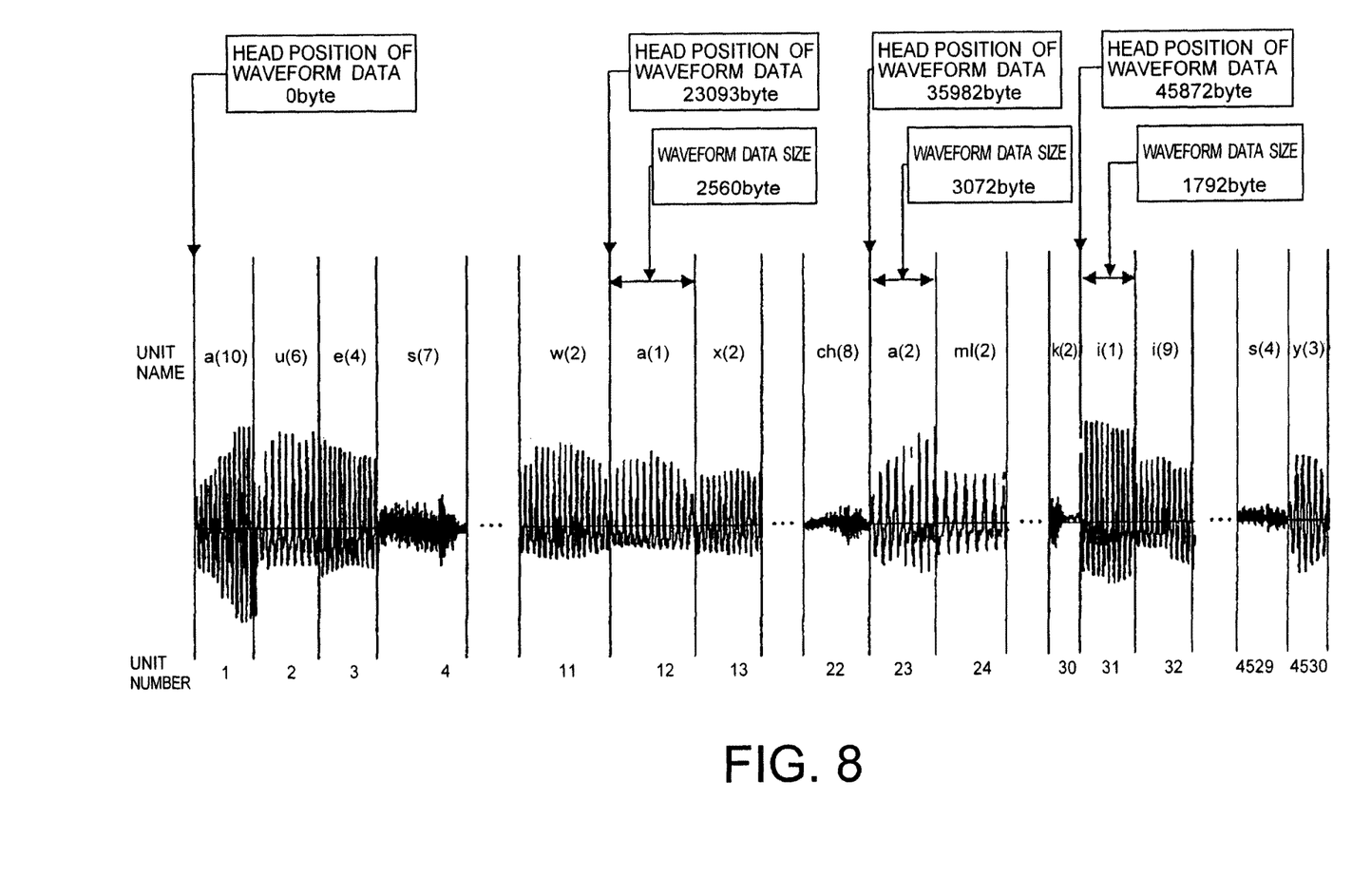
FIG. 8 is a schematic diagram of one example of a speech unit waveform corresponding to the speech unit information in FIG. 7.

In the speech unit waveform corpus 104a, a speech unit waveform may be a waveform itself, a spectrum parameter transformed from a speech unit by cepstrum, or encoded data from the speech unit by various methods (μlaw, ADPCM, CELP). In the first embodiment, a speech unit waveform stored in the speech unit waveform corpus 104a is regarded as a speech waveform itself. FIG. 8 shows one example of the speech unit waveform corresponding to speech unit information in FIG. 7.

Figure 9:
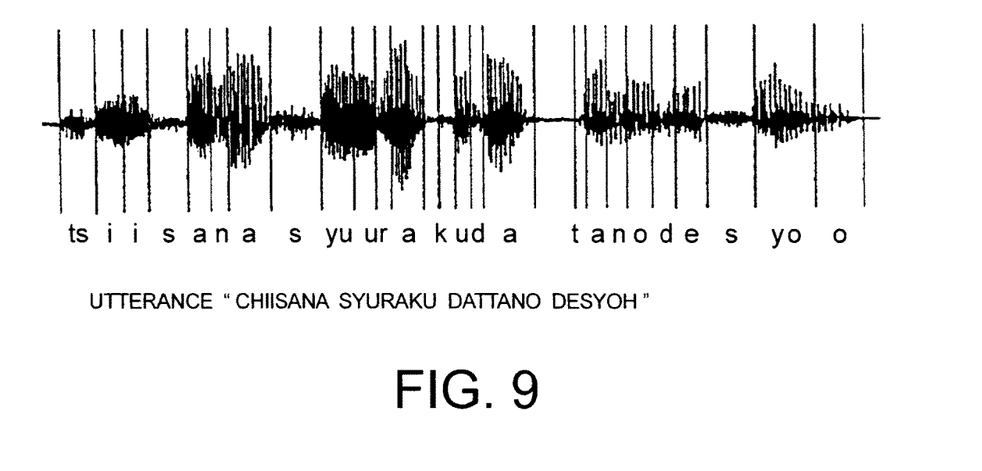
FIG. 9 is a schematic diagram of one example of a speech unit waveform extracted for each phoneme.

In order to store a plurality of waveforms in the speech unit waveform corpus 104a, for example, utterance data (previously recorded) is labeled to each phoneme (labeling) as shown in FIG. 9, and a waveform of each phoneme is extracted from the utterance data. The waveform is stored as a speech unit waveform in the speech unit waveform corpus 104a. In this case, a phoneme name (the speech unit belongs), a fundamental frequency, a phoneme segmental duration, and cepstrum of speech unit boundary are extracted, and the data size and the head position of each waveform are calculated. These elements are correspondingly stored in the speech unit information corpus 104c.

As a memory medium used for the speech unit waveform corpus 104a and the speech unit information corpus 104c, for example, a semiconductor memory (RAM, ROM, flash memory), HDD, CD-R, CD-RW, DVD-R, DVD-RAM, DVD-RW may be used. In this case, data quantity stored in the speech unit information corpus 104c is relatively few, and frequent access to the speech unit information corpus 104c is necessary. Accordingly, a semiconductor memory (RAM or ROM) having quick access speed is desired.

The speech unit waveform corpus 104a stores a large capacity of waveform data. Accordingly, a HDD or a flash memory of NAND type having inexpensive price per byte and large capacity is desired. In the first embodiment, a memory medium used for the speech unit waveform corpus 104a is HDD, and a memory medium used for the speech unit information corpus 104c is RAM.

Next, operation of the speech unit selection unit 104b is explained. First, the speech unit selection unit 104b divides a phoneme sequence (sent from the prosody processing unit 103) to each synthesis unit to select speech unit waveforms. Hereinafter, each section that the phoneme sequence is divided to the synthesis unit is called a segment.

Next, in the speech unit selection unit 104b, distortion of a synthesized speech (by concatenating speech unit waveforms) based on a phoneme sequence (sent from the prosody processing unit 104b) is calculated by referring to the speech unit information corpus 104c. A speech unit sequence (optimum unit sequence) having the minimum distortion is identified.

In case of generating a synthesized speech by concatenating waveforms stored in the speech unit waveform corpus 104a, distortion of the synthesized speech is calculated as a weighted sum of a target cost and a concatenation cost. The target cost represents a distortion based on a difference between a unit environment of speech unit stored in the speech unit information corpus 104c and a target unit environment (fundamental frequency and phoneme segmental duration) sent from the prosody processing unit 103. The concatenation cost represents a distortion based on a difference of unit environment (cepstrum of speech unit boundary) between two speech units adjacently concatenated. Briefly, the target cost is the distortion that occurs when a speech unit (stored in the speech unit waveform corpus 104*a*) is used in a target unit environment of the input text. The concatenation cost is the distortion that occurs because of discontinuity of unit environment between two speech units concatenated.

In the first embodiment, a fundamental frequency cost and a phoneme segmental duration cost are used as the target cost. The fundamental frequency cost is based on a difference between a fundamental frequency of a target unit environment (sent from the prosody processing unit 103) and a fundamental frequency of unit environment of the speech unit (stored in the speech unit information corpus 104*c*). The phoneme segmental duration cost is based on difference between a phoneme segmental duration of a target unit environment (sent from the prosody processing unit 103) and a phoneme segmental duration of unit environment of the speech unit (stored in the speech unit information corpus 104*c*).

Furthermore, a spectrum concatenation cost is used as the concatenation cost. The spectrum concatenation cost is based on difference of cepstrum of speech unit boundary (stored in the speech unit information corpus 104*c*) between two concatenated speech units.

Figure 10A:
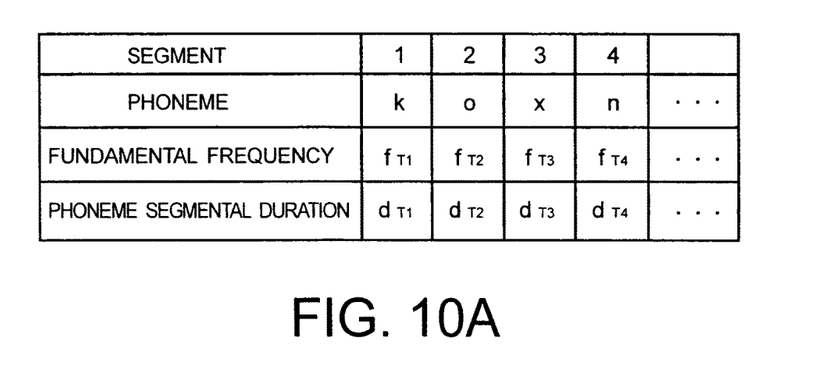
FIGS. 10A and 10B are schematic diagrams of examples to explain a fundamental frequency cost, a phoneme segmental duration cost, and a spectral concatenation cost.
Figure 10B:
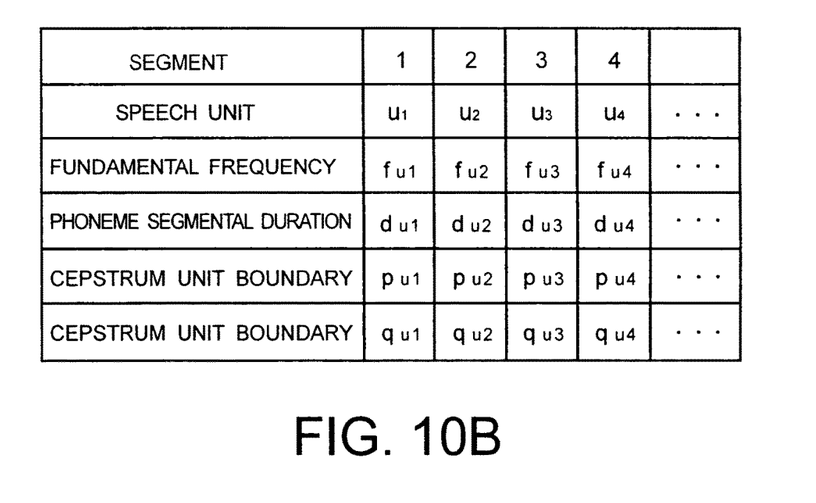

Next, a method for calculating the fundamental frequency cost, the phoneme segmental duration cost, and the spectrum concatenation cost is explained using FIGS. 10A and 10B.

In FIG. 10A, a phoneme sequence (obtained by the prosody processing unit 103) and a target unit environment (fundamental frequency and phoneme segmental duration) for the text "CONNICHIWA" are shown. As mentioned-above, in the first embodiment, a synthesis unit is regarded as a phoneme. Accordingly, the phoneme sequence (each phoneme) and the target unit environment (the fundamental frequency ($f_{Ti}$) and the phoneme segmental duration ($d_{Ti}$)) are determined for each segment.

In FIG. 10B, a speech unit sequence of speech unit $u_i$ selected from the speech unit waveform corpus 104*a* for each segment in FIG. 10A is shown. The speech unit $u_i$ is selected from a plurality of speech units having a phoneme of segment i as the unit environment. As shown in FIG. 10B, a fundamental frequency ($f_{ui}$), a phoneme segmental duration ($d_{ui}$), and cepstrums ($p_{ui}$, $q_{ui}$) of unit boundary are stored for the speech unit $u_i$ (stored in the speech unit information corpus 104*c*). As to the cepstrum of unit boundary, cepstrum of a unit boundary with a previous speech unit is $p_{ui}$, and cepstrum of a unit boundary with a following speech unit is $q_{ui}$.

In this case, the fundamental frequency cost $C_f(i,u_i)$, the phoneme segmental duration cost $C_d(i,u_i)$, and the spectrum concatenation cost $C_s(i,u_i)$ for each segment are calculated by following equations (1), (2), and (3).

$$C_f(i,u_i)=\{\log(f_{ui})-\log(f_{Ti})\}^2 \quad (1)$$

$$C_d(i,u_i)=(d_{ui}-d_{Ti})^2 \quad (2)$$

$$C_s(i,u_i)=\|q_{u(i-1)}-p_{ui}\| \quad (3)$$

$\|x\|$: norm of vector x

A cost $C_{SG}(i,u_i)$ of each segment is calculated as a weighted sum of above costs by following equation (4).

$$C_{SG}(i,u_i)=w_f C_f(i,u_i)+w_d C_d(i,u_i)+w_s C_s(i,u_i) \quad (4)$$

$W_f$, $w_d$, $w_s$: weight coefficient previously fixed

In case of generating a synthesized speech by concatenating speech units $\{u_1, u_2, \ldots\}$ in FIG. 10B, distortion C of the synthesized speech is calculated by following equation (5).

$$C = \sum_{i=1}^{N} C_{SG}(i, u_i) \quad (5)$$

wherein N is the number of segments divided from a phoneme sequence (of input text) by synthesis unit.

As mentioned-above, in case of a synthesized speech by concatenating speech units (stored in the speech unit waveform corpus 104*a*) based on a phoneme sequence (sent from the prosody processing unit 103), distortion of the synthesized speech is calculated by referring to the speech unit information corpus 104*c*. Based on the equation (5), an optimum speech unit sequence having the minimum distortion C is identified. For example, the optimum speech unit sequence may be identified by calculating distortion C for each combination of all speech units based on the phoneme sequence (sent from the prosody processing unit 103). Furthermore, the optimum speech unit sequence can be effectively identified using DPM (Dynamic Programming Method).

Next, in the speech unit concatenation unit 104*d*, based on a speech unit sequence (sent from the speech unit selection unit 104*b*), a waveform of each speech unit is read from the speech unit waveform corpus 104*a* by referring to unit waveform position (address) in the speech unit information corpus 104*c*. By modifying and concatenating the waveforms based on a target unit environment (obtained by the prosody processing unit 103), a synthesized speech is generated.

Figure 11:
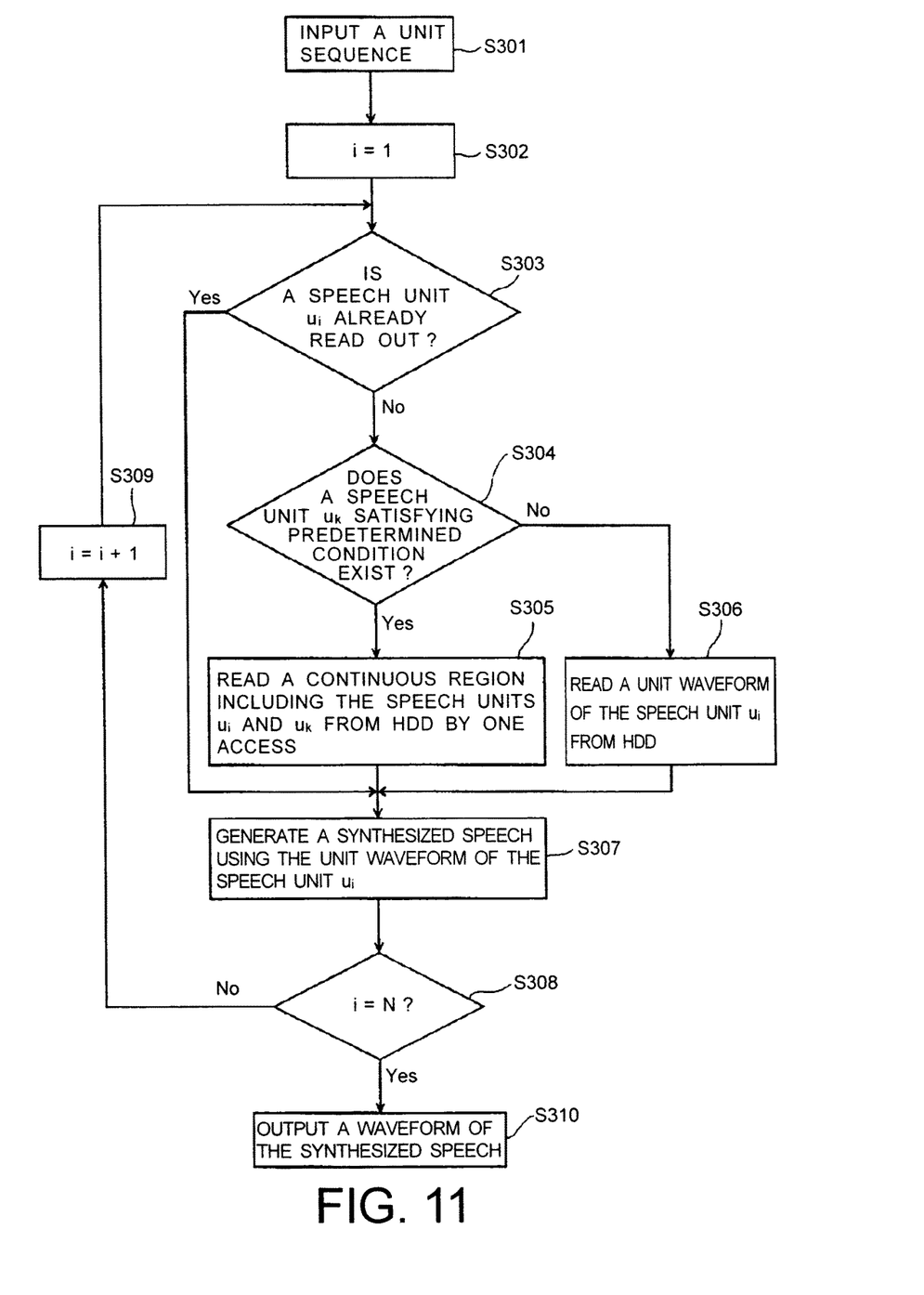
FIG. 11 is a flow chart of processing of a speech unit concatenation unit 104d in FIG. 1.

Operation of the speech unit concatenation unit 104*d* is explained by referring to FIG. 11. First, a speech unit sequence $u_i$ (i=1, … N) of N units is input from the speech unit selection unit 104*b* (S301). Next, a value of index (representing a speech unit position of object) is initialized by "1" (S302).

Next, it is checked whether a waveform of the speech unit $u_i$ is already read from the speech unit waveform corpus 104*a* (S303). If the waveform is already read and copied on a buffer prepared in the speech unit concatenation unit 104*d*, read processing of speech unit waveform is skipped, and processing is forwarded to generation processing S307 of synthesized speech.

On the other hand, if the waveform is not read, it is checked whether a speech unit $u_k$ satisfying a predetermined condition exists as a following speech unit of the speech unit $u_i$ in the speech unit sequence (S304). The predetermined condition represents a positional relationship between the speech units $u_i$ and $u_k$ in the speech unit sequence, and a positional (address) relationship between waveforms of the speech units $u_i$ and $u_k$ in the HDD (the speech unit waveform corpus 104*a*).

If the speech unit $u_k$ satisfying the condition exists as the following speech unit of the speech unit $u_i$, a continuous memory region including two waveforms of the speech units $u_i$ and $u_k$ is read from the HDD, and copied onto the buffer (S305).

If the speech unit $u_k$ satisfying the condition does not exist as the following speech unit of the speech unit $u_i$, a waveform of the speech unit $u_i$ is read from the HDD, and copied onto the buffer (S306).

Next, a synthesized speech is generated using the waveform of the speech unit $u_i$ copied on the buffer (S307). This method is explained afterwards.

Next, it is checked whether the speech unit $u_i$ is the last speech unit in the speech unit sequence (S308). If the speech unit $u_i$ is the last speech unit, waveforms of the synthesized speech is output (S310), and processing is completed. If the speech unit $u_i$ is not the last speech unit, the index is incremented by "1" (S309), and processing is returned to S303 in order to generate a synthesized speech from the following speech unit.

Figure 12:
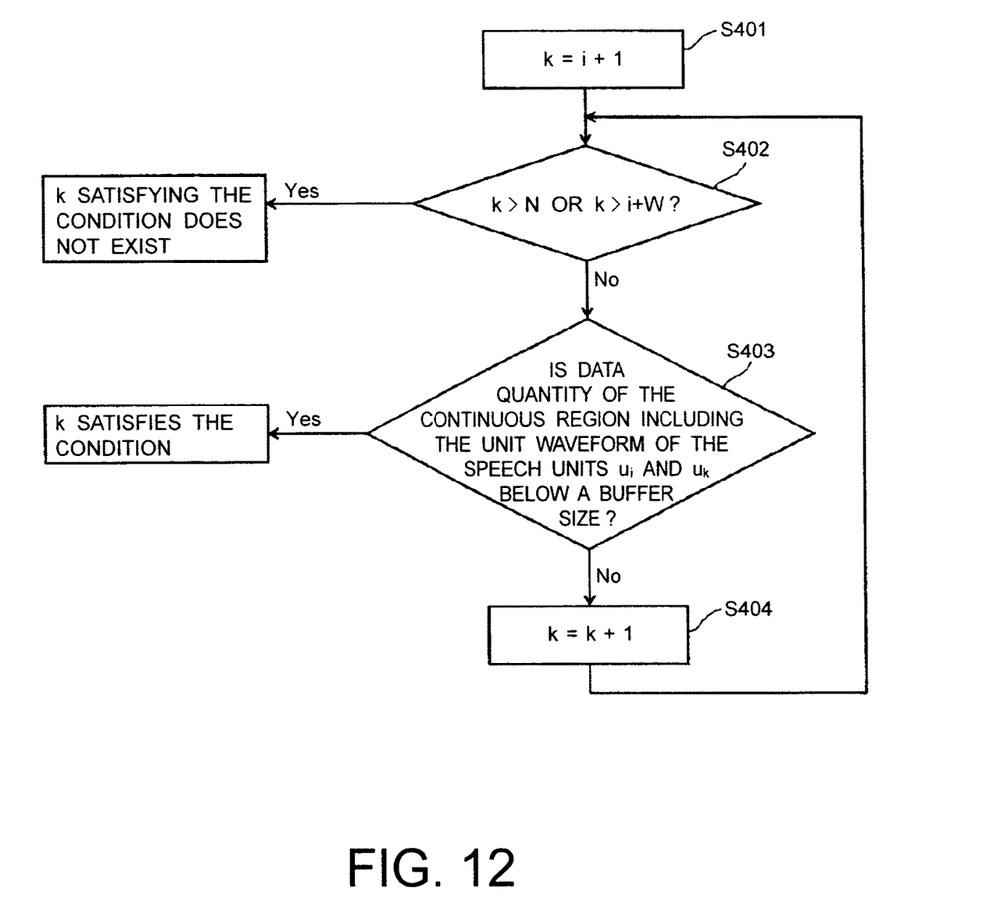
FIG. 12 is a flow chart of processing of S304 in FIG. 11.

Next, decision processing of the condition at S304 is explained in detail by referring to FIG. 12. In this decision method, as to combination of a speech unit $u_i$ and any one $u_k$ of following speech units of the speech unit $u_i$, it is decided whether a data quantity ($D_s(u_i,u_k)$) of a continuous region including waveforms of two speech units $u_i$ and $u_k$ on the HDD is below a buffer size.

First, an index k is initialized by "i+1" representing a following speech unit of the speech unit $u_i$ in the speech unit sequence (S401). If the index k is above "N" or "i+W", the decision result of this condition is "No", and processing is completed (S402). In this case, "W" is positive integral number as arbitrary settable constant.

Next, data quantity $D_s(u_i,u_k)$ of a continuous region including waveforms of two speech units $u_i$ and $u_k$ on the HDD is calculated. The data quantity is decided to be below a buffer size prepared for copying waveforms (S403). In this case, by referring to the speech unit information corpus 104c, a value of the data quantity $D_s(u_i,u_k)$ can be calculated by summing each size of waveforms of all speech units within two speech units $u_i$ and $u_k$.

If the data quantity $D_s(u_i,u_k)$ is below the buffer size, decision result of this condition is "Yes", and processing is completed. On the other hand, if the data quantity $D_s(u_i,u_k)$ is not below the buffer size, the index k is incremented by 1, and processing is returned to S402 (S404).

In the above decision method, in case of the decision result "Yes", waveforms of two speech units $u_i$ and $u_k$ can be read from the HDD by one access and copied onto the buffer.

At S403, the data quantity $D_s(u_i,u_k)$ is compared with the buffer size. However, if the buffer already stores waveforms read by previous processing, the data quantity $D_s(u_i,u_k)$ may be compared with a difference between the buffer size and a size of the stored waveforms. Alternatively, if the buffer already stores waveforms, the decision result may be unconditionally "No".

Furthermore, at S403, by calculating a number of speech units $D_n(u_i,u_k)$ of a continuous region including waveforms of two speech units $u_i$ and $u_k$ on the HDD, the number may be decided to be below a maximum $D_{nmax}$ of speech units previously set. If the maximum is already known, a waveform can be decided to be read onto the buffer by the number of speech units. For example, in case of "$D_{nmax}=2$ and W=2", this decision represents "waveforms of two continuous speech units $u_i$ and $u_{i+1}$ in a speech unit sequence are adjacently stored on the HDD".

Figure 13:
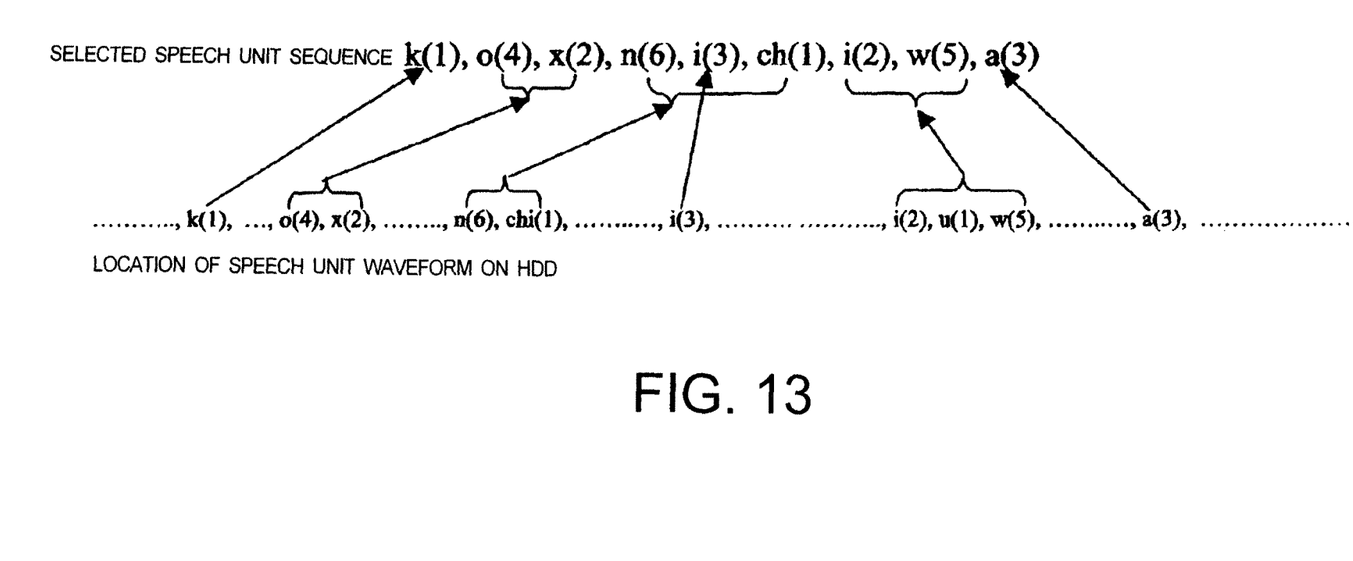
FIG. 13 is a schematic diagram of one example of a speech unit waveform read out.

FIG. 13 is a schematic diagram of one example of speech unit waveforms read out according to the first embodiment. In this example, decision is executed on condition that "W=3 and $D_n(u_i, u_k)$ is not above 3 ($D_{nmax}=3$)". The speech unit sequence includes nine speech units. In this case, "o(4) and x(2)", "n(6) and ch(1)", and "i(2) and w(5)" can be respectively read by one access. Accordingly, in order to generate a synthesized speech, all necessary speech unit waveforms can be read from the HDD by six accesses.

Figure 14A:
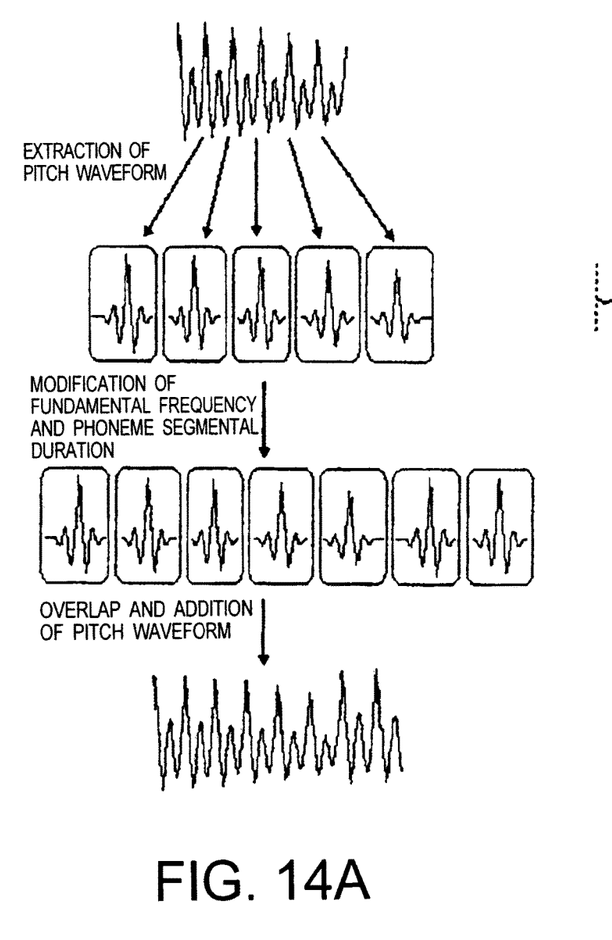
FIGS. 14A and 14B are schematic diagrams to explain generation method of synthesized speech of S307 in FIG. 11.
Figure 14B:
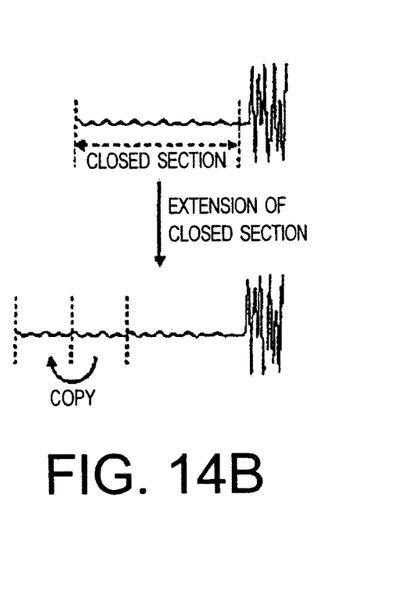

Next, a method for generating a synthesized speech at S307 is explained by referring to FIGS. 14A and 14B. As shown in FIG. 14A, as to a voiced sound, a pitch waveform is extracted from a speech unit waveform, a fundamental frequency of the pitch waveform is modified to be equal to a fundamental frequency of the target unit environment (obtained by the prosody processing unit 103), and adequate number of modified pitch waveforms are overlapped and added based on a phoneme segmental duration of the target unit environment (obtained by the prosody processing unit 103).

As a method for extracting a pitch waveform from a speech unit waveform, for example, a fundamental pitch synchronous window, a reverse discrete Fourier transform of power spectrum envelop (obtained by cepstrum analysis or PSE analysis), or a closed loop learning method to extract a pitch waveform having low distortion for natural speech in synthesized speech level is used. Alternatively, by previously extracting a pitch waveform, a pitch waveform sequence may be stored as a speech unit waveform in the speech unit waveform corpus 104a.

On the other hand, unvoiced sound is not periodic and the pitch waveform does not exist. Accordingly, as to the unvoiced sound, a phoneme segmental duration of the speech unit waveform is modified based on a phoneme segmental duration of the target unit environment (obtained by the prosody processing unit 103). For example, unvoiced explosion sound and unvoiced break sound include a (closed) section to stop breath by closing articulation organs before utterance. Accordingly, as shown in FIG. 14B, by copying adaptive section in a closed section, the closed section is extended so that the speech unit has adaptive phoneme segmental duration. Furthermore, as to unvoiced friction sound, in case of shortening a speech unit, a waveform having adaptive length centering around the speech unit is cut down. In case of lengthening a speech unit, a waveform having adaptive length centering around the speech unit is repeated. As a result, the speech unit is modified to have adaptive segmental duration. In this case, by smoothing around concatenation part of waveforms, discontinuous feeling of synthesized speech caused by cut or repeat of waveform can be reduced.

Thus, a speech unit waveform of which fundamental frequency and segmental duration are modified is concatenated with a synthesized speech generated from a previous speech unit waveform. Accordingly, the synthesized speech is updately generated. The synthesized speech generated from the speech unit concatenation unit 104d is sent to the synthesized speech output unit 105.

In the first embodiment, if a frequency of one access read that two speech unit waveforms are read by one access is high, processing time can be effectively reduced. The frequency of one access read is affected by sort order (address order) of speech unit waveforms on the HDD. Accordingly, by optimizing the sort order, the processing time can be more reduced.

Hereinafter, a method for optimizing the sort order of speech unit waveforms on the HDD is explained. In the speech synthesized apparatus, assume that a condition of one access read is "waveforms of two continuous speech units $u_i$ and $u_{i+1}$ in a speech unit sequence are adjacently stored on the HDD.".

First, a large number of texts are prepared as training data, and input to the speech synthesis apparatus. By selecting speech units corresponding to phonemes of the texts, a speech unit sequence is generated.

On the other hand, each combination of two speech units is extracted from all speech units of waveforms stored on the HDD, and a frequency that the two speech units are continuously included in the speech unit sequence (generated by above processing) is counted. Assume that a number of speech unit waveforms stored on the HDD is $N_{all}$, and a frequency is $H(p, q)$ ($1=<P<q=<N_{all}$, p, q: a number uniquely assigned to each speech unit). In the optimization process, a number of units adjacently located to each speech unit waveform is $C(p)$ ($1=<p=<N_{all}$). In initial status that location of all speech unit waveforms is not determined, all speech units p are initialized as "$C(p)=2$". In status that a speech unit waveform adjacently located in front of or rear of a speech unit waveform p is determined, the speech unit waveform p is set as "$C(p)=1$". In status that two speech unit waveforms adjacently located in both sides of the speech unit waveform p is determined, the speech unit waveform p is set as "$C(p)=0$".

Figure 15:
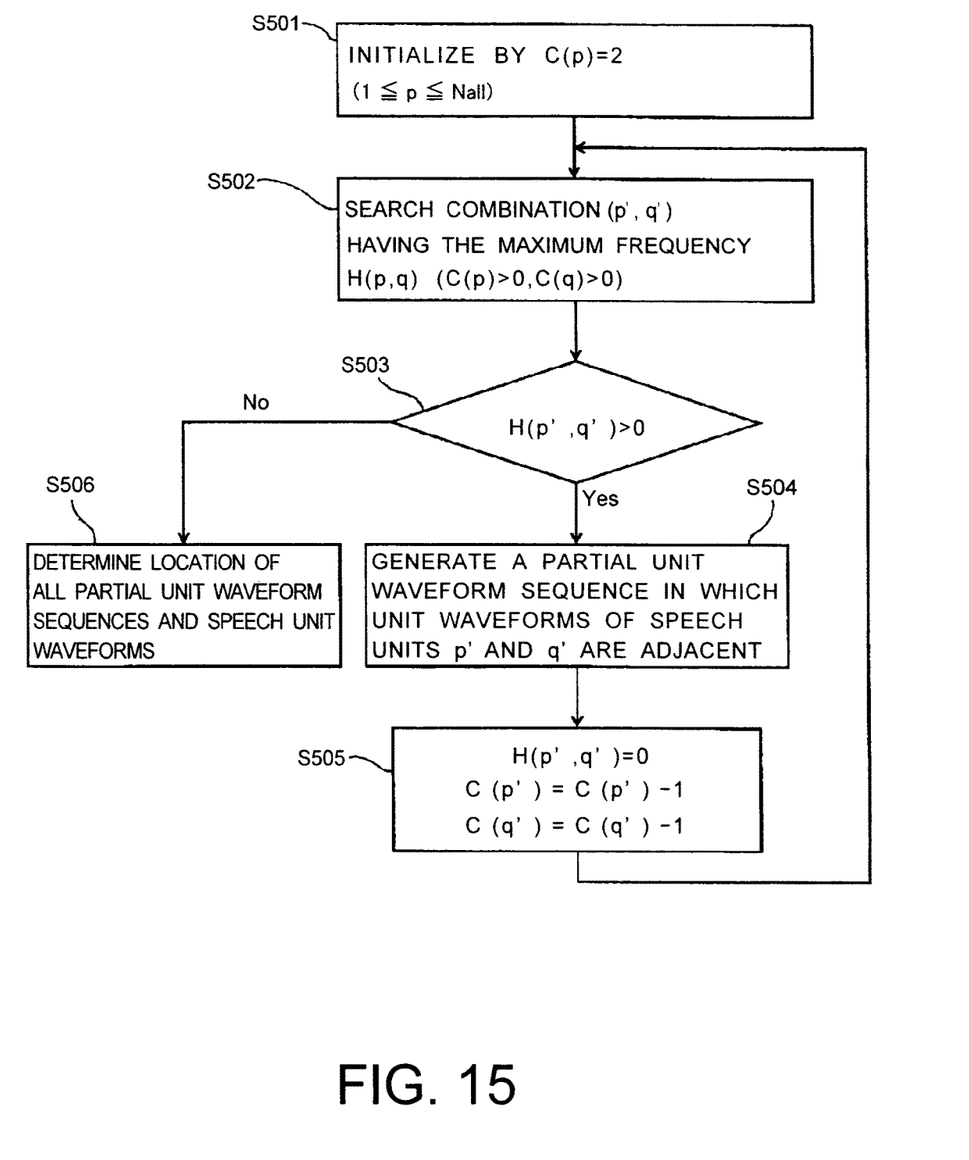
FIG. 15 is a flow chart of processing of optimization of address order of speech unit waveform.

Next, detail processing of optimization method is explained by referring to FIG. 15. First, all "$C(p)$" is initialized by "2" (S501). Next, in two speech units p, q ($C(p)>0$, $C(q)>0$), combination (p', q') having the maximum frequency $H(p', q')$ is searched (S502). If the maximum frequency $H(p', q')$ is above "0" (S503), by adjacently concatenating two speech unit waveforms p' and q', a partial unit waveform sequence is generated (S504).

This operation is any of following three methods.
(1) By concatenating two speech unit waveforms, new partial unit waveform sequence is generated.
(2) A speech unit waveform is concatenated to the front end or rear end of a partial unit waveform sequence already generated.
(3) By concatenating two partial unit waveform sequences each already generated, one partial unit waveform sequence is generated.

However, if two speech unit waveforms p' and q' are the front end and rear end of the same partial unit waveform sequence already generated, the two speech unit waveforms p' and q' are not concatenated in order not to circulate the same partial unit waveform sequence.

Next, it is set that $H(p', q')=$"0", and $C(p')$ and $C(q')$ are decremented by "1" (S505). Processing is returned to S502, and processing of S503 is repeated until "$H(p', q')$. 0" for new combination (p', q'). In this case, "$H(p', q')=0$" represents that combination of two connectable speech units of which appearance frequency is above "0" is not included in the speech unit sequence. Accordingly, by adaptively concatenating each speech unit waveform (not concatenated yet on the HDD) with all partial unit waveform sequences, one speech unit waveform sequence is generated.

As mentioned-above, by suitably locating speech unit waveforms on the HDD based on a speech unit sequence of the training data, the probability that waveforms of two speech units are located next to each other on the HDD is high, because these speech units usually appear continuously in a speech unit sequence. As a result, frequency of one access read is high, and processing time can be reduced.

Furthermore, as to a speech unit easy to be selected, by copying a waveform of the speech unit at different address on the HDD, a plurality of the same waveforms may be stored on the HDD. As a result, the frequency of one access read is also high. For example, in case that X pieces of waveform of the speech unit p are copied, by initializing as "$C(p)=2*X$", waveforms of the speech units can be suitably located.

As mentioned-above, in the speech synthesis apparatus of the first embodiment, in case that two speech units included in the speech unit sequence satisfies a predetermined condition, waveforms of the two speech units can be read from the HDD by one access. Accordingly, a number of HDD access is reduced, and access time to read the waveforms is reduced. As a result, processing time to synthesize a speech is also reduced.

As to time taken to read waveform from the HDD, except for acquisition time to actually read the waveform from the HDD, preparation time to read is necessary. The preparation time includes time to move a head to read data and time waiting for the head to reach a memory address of the waveform. In case of reading waveform data, the preparation time is often longer than the acquisition time. Accordingly, reduction of the number of accesses (shortening of the preparation time) is effective for reduction of processing time. In this way, if a memory medium (except for the HDD) requiring the preparation time to acquire data is utilized as the speech unit waveform corpus 104a, processing time is more reduced.

In the first embodiment, two speech unit waveforms are read from the HDD during one access. However, the speech synthesis apparatus may be composed so that at least three speech unit waveforms are read from the HDD during one access. In this case, by further reducing the number of HDD access, the processing time can be further reduced.

In the disclosed embodiments, the processing can be accomplished by a computer-executable program, and this program can be realized in a computer-readable memory device.

In the embodiments, the memory device, such as a magnetic disk, a flexible disk, a hard disk, an optical disk (CD-ROM, CD-R, DVD, and so on), an optical magnetic disk (MD and so on) can be used to store instructions for causing a processor or a computer to perform the processes described above.

Furthermore, based on an indication of the program installed from the memory device to the computer, OS (operation system) operating on the computer, or MW (middle ware software), such as database management software or network, may execute one part of each processing to realize the embodiments.

Furthermore, the memory device is not limited to a device independent from the computer. By downloading a program transmitted through a LAN or the Internet, a memory device in which the program is stored is included. Furthermore, the memory device is not limited to one. In the case that the processing of the embodiments is executed by a plurality of memory devices, a plurality of memory devices may be included in the memory device. The component of the device may be arbitrarily composed.

A computer may execute each processing stage of the embodiments according to the program stored in the memory device. The computer may be one apparatus such as a personal computer or a system in which a plurality of processing apparatuses are connected through a network. Furthermore, the computer is not limited to a personal computer. Those skilled in the art will appreciate that a computer includes a processing unit in an information processor, a microcomputer, and so on. In short, the equipment and the apparatus that can execute the functions in embodiments using the program are generally called the computer.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. An apparatus for synthesizing a speech, comprising:
processing circuitry configured to
acquire, from a waveform memory, speech unit waveforms corresponding to a plurality of speech units for synthesizing the speech, and
synthesize the speech by utilizing the speech unit waveforms,
wherein the processing circuitry copies at least two speech unit waveforms from a continuous region of the waveform memory onto a buffer by one access, a data quantity of the at least two speech unit waveforms being less than or equal to a size of the buffer, the at least two speech unit waveforms corresponding to at least two speech units included in the plurality of speech units.

2. The apparatus according to claim 1, wherein
the processing circuitry selects the plurality of speech units for synthesizing the speech by referring to speech unit information stored in an information memory.

3. The apparatus according to claim 2, wherein
an access speed of the information memory is quicker than an access speed of the waveform memory.

4. The apparatus according to claim 1, further comprising:
a text input unit by which a text to be converted to the speech is input.

5. The apparatus according to claim 1, further comprising:
at least one of a speaker or a head phone by which the speech is output.

6. The apparatus according to claim 1, further comprising:
a computer operation system configured to execute copying of the at least two speech unit waveforms by the processing circuitry.

7. The apparatus according to claim 1, further comprising:
a middle-ware (MW) program configured to execute copying of the at least two speech unit waveforms by the processing circuitry.

8. The apparatus according to claim 1, wherein
the speech unit waveform is one of a waveform itself, a parameter to generate the waveform, encoded data of the waveform, or a pitch waveform.

9. The apparatus according to claim 1, wherein
the processing circuitry synthesizes the speech by concatenating the speech unit waveforms with modification or without modification.

10. A method for synthesizing a speech, comprising:
acquiring by processing circuitry, from a waveform memory, speech unit waveforms corresponding to a plurality of speech units for synthesizing the speech; and
synthesizing by the processing circuitry, the speech by utilizing the speech unit waveforms,
wherein the acquiring includes
copying at least two speech unit waveforms from a continuous region of the waveform memory onto a buffer by one access, a data quantity of the at least two speech unit waveforms being less than or equal to a size of the buffer, the at least two speech unit waveforms corresponding to at least two speech units included in the plurality of speech units.

11. The method according to claim 10, further comprising:
selecting by the processing circuitry, the plurality of speech units for synthesizing the speech by referring to speech unit information stored in an information memory.

12. The method according to claim 10, wherein
the copying is executed by a computer operation system.

13. The method according to claim 10, wherein
the copying is executed by a middle-ware (MW) program.

14. The method according to claim 10, further comprising:
outputting the speech by at least one of a speaker or a head phone.

15. The method according to claim 10, wherein
the speech unit waveform is one of a waveform itself, a parameter to generate the waveform, encoded data of the waveform, or a pitch waveform.

16. The method according to claim 10, wherein
the synthesizing includes
synthesizing the speech by concatenating the speech unit waveforms with modification or without modification.

17. A non-transitory computer readable memory storing program instructions, which when executed by a computer, results in performance of a method for synthesizing a speech, the method comprising:
acquiring by processing circuitry, from a waveform memory, speech unit waveforms corresponding to a plurality of speech units for synthesizing the speech; and
synthesizing by the processing circuitry, the speech by utilizing the speech unit waveforms,
wherein the acquiring includes
copying at least two speech unit waveforms from a continuous region of the waveform memory onto a buffer by one access, a data quantity of the at least two speech unit waveforms being less than or equal to a size of the buffer, the at least two speech unit waveforms corresponding to at least two speech units included in the plurality of speech units.

18. The non-transitory computer readable medium according to claim 17, further comprising:
selecting by the processing circuitry, the plurality of speech units for synthesizing the speech by referring to speech unit information stored in an information memory.

19. The non-transitory computer readable medium according to claim 17, wherein
the speech unit waveform is one of a waveform itself, a parameter to generate the waveform, encoded data of the waveform, or a pitch waveform.

20. The non-transitory computer readable medium according to claim 17, wherein
the synthesizing includes
synthesizing the speech by concatenating the speech unit waveforms with modification or without modification.

* * * * *